(12) United States Patent
Gastaldo et al.

(10) Patent No.: US 9,859,842 B2
(45) Date of Patent: Jan. 2, 2018

(54) DEVICE AND METHOD FOR TESTING A CONCENTRATED PHOTOVOLTAIC MODULE

(71) Applicant: Saint-Augustin Canada Electric Inc., Saint-Augustin de Desmaures (CA)

(72) Inventors: Philippe Gastaldo, Pontcharra (FR); Mathieu Guilhem, Domene (FR)

(73) Assignee: Saint-Augustin Canada Electric Inc., Saint-Augustin de Desmaures (CA)

( * ) Notice: Subject to any disclaimer, the term of this patent is extended or adjusted under 35 U.S.C. 154(b) by 0 days.

(21) Appl. No.: 15/036,037

(22) PCT Filed: Nov. 14, 2014

(86) PCT No.: PCT/EP2014/074626
§ 371 (c)(1),
(2) Date: Aug. 18, 2016

(87) PCT Pub. No.: WO2015/071420
PCT Pub. Date: May 21, 2015

(65) Prior Publication Data
US 2016/0352287 A1     Dec. 1, 2016

(30) Foreign Application Priority Data
Nov. 14, 2013   (FR) ...................... 13 61137

(51) Int. Cl.
*G01R 31/26*     (2014.01)
*H02S 50/15*     (2014.01)
(Continued)

(52) U.S. Cl.
CPC .......... *H02S 50/15* (2014.12); *H01L 31/0543* (2014.12); *H01L 31/0687* (2013.01); *H02S 40/22* (2014.12); *Y02E 10/52* (2013.01)

(58) Field of Classification Search
None
See application file for complete search history.

(56) References Cited

U.S. PATENT DOCUMENTS 7,309,850 B2 * 12/2007 Sinton ..................... H02S 50/10
250/203.4
7,667,479 B2 *  2/2010 Kuo ..................... H01L 31/0547
136/259
(Continued)

FOREIGN PATENT DOCUMENTS

WO       2010003115 A1      1/2010

OTHER PUBLICATIONS

International Search Report for International Application No. PCT/EP2014/074626, dated Jan. 13, 2015, 2 pages.
(Continued)

*Primary Examiner* — Jermele M Hollington
*Assistant Examiner* — Demetrius Pretlow
(74) *Attorney, Agent, or Firm* — TraskBritt

(57) ABSTRACT

The disclosure relates to a device and method for testing a concentrated photovoltaic module comprising a plurality of sub-modules, which comprises: light sources; and parabolic mirrors coupled with the light sources so as to reflect the light from each source in quasi-collimated light beams toward the module to be tested, perpendicular to the module. Each light source comprises: an optical system comprising two parallel lenses on either side of a diaphragm; a lamp on an optical axis of the optical system; a reflector arranged on the axis, on the side opposite the optical system relative to the lamp, and translatably movable along the axis; and a housing containing the optical system, the lamp and the reflector and including an outlet opening for the light beam on the axis.

16 Claims, 3 Drawing Sheets

(51) Int. Cl.
    *H01L 31/054*     (2014.01)
    *H02S 40/22*     (2014.01)
    *H01L 31/0687*     (2012.01)

(56) References Cited

U.S. PATENT DOCUMENTS

| | | | |
|---|---|---|---|
| 8,988,096 B1* | 3/2015 | Naiknaware | H02S 50/10 324/761.01 |
| 2010/0066382 A1* | 3/2010 | Merkle | H01L 31/0543 324/501 |
| 2012/0262199 A1* | 10/2012 | Jungwirth | F21V 13/08 324/761.01 |
| 2014/0332688 A1* | 11/2014 | Cothuru | F24J 2/14 250/353 |
| 2015/0236641 A1* | 8/2015 | Schmid | H02S 50/10 324/761.01 |

OTHER PUBLICATIONS

International Written Opinion for International Application No. PCT/EP2014/074626, dated Jan. 13, 2015, 5 pages.

\* cited by examiner

DEVICE AND METHOD FOR TESTING A CONCENTRATED PHOTOVOLTAIC MODULE

CROSS-REFERENCE TO RELATED APPLICATIONS

This application is a national phase entry under 35 U.S.C. §371 of International Patent Application PCT/EP2014/074626, filed Nov. 14, 2014, designating the United States of America and published in English as International Patent Publication WO 2015/071420 A1 on May 21, 2015, which claims the benefit under Article 8 of the Patent Cooperation Treaty to French Patent Application Serial No. 1361137, filed Nov. 14, 2013.

TECHNICAL FIELD

This disclosure relates to a device for testing a concentrated photovoltaic module, and a testing method for implementing the device.

BACKGROUND

A concentrated photovoltaic module (CPV) essentially comprises a photovoltaic cell (for example, a multi-junction cell) and a concentrator designed to concentrate solar radiation toward the cell.

In the case of a multi-junction cell, the different junctions are arranged in series, each of the junctions being adapted to a specific spectral band of solar radiation.

Multi-junction cells, which are a smaller size than conventional solar cells made of silicon, have the advantage of offering better efficiency, but in order to function, need a higher light intensity.

In a CPV module, the cells are associated with a concentrator, for example, a Fresnel lens, which concentrates solar radiation toward the cell.

Also, photovoltaic modules are designed to be mounted on a sun-follower system (also called a "tracker") so as to optimally orient the module as a function of the trajectory of the sun so that the concentrators focus the rays of the sun onto the cells.

During manufacture of such photovoltaic modules, it is customary to verify the operation and performance of each module, with a view to detecting any failure of any one of the junctions, defects in quality or positioning of concentrators, or any other anomaly of the module before it is expedited.

The modules are frequently combined by being mounted totally or partially in series. In this case, performance of the overall system will be limited by the weakest element. It can, therefore, prove useful to select the modules before they are combined so that they are homogeneous in response. In this respect, it is important to be able to measure the performance of this module.

For this purpose, it is known to simulate the lighting of the sun by means of a lighting device generally called a "flasher," which generates a light beam having irradiance, spectral power distribution and angular divergence close to those of the sun. These characteristics are to conform over the entire surface of the module to be tested.

CPV modules currently commercially available have relatively small dimensions (of the order of 0.5 to 1.5 $m^2$). There are lighting devices that simulate solar lighting on a module of this type.

The Soitec company has marketed large-size solar modules, having a surface of several $m^2$, consisting of several CPV sub-modules connected by a single chassis.

So, for example, a module of 8 $m^2$ can be formed by two rows of six sub-modules, which can optionally be connected in series.

There is, therefore, the problem of being able to test a large-size module, since the sub-modules are connected totally or partially in series and their mechanical integrity is assured by a single chassis, they cannot be tested independently.

On the other hand, it is important to ensure the operation of the assembly before it is installed.

It is, therefore, necessary to be able to verify the performance of the complete module by simulating lighting that is as close as possible to solar radiation.

In this respect, the constraints the lighting device must respect are the following:
- irradiance comparable to that produced by the sun at ground level, that is, of the order of 1 kW/$m^2$,
- reproduction of the complete solar spectrum, from ultraviolet to infrared, by respecting spectral densities,
- angular divergence close to that of solar light, that is, 0.5° (±0.25°),
- considerable spatial uniformity of the irradiance (the aim being inhomogeneity of irradiance less than or equal to 5%).

Known lighting devices do not respond to these demands for a large-size module.

In fact, these devices offer either a more reduced field or characteristics (especially angular divergence) too far removed from those of the sun.

Another constraint to be considered in designing the lighting device is the compactness of the test installation.

It might be feasible to use several known devices that would illuminate each part of the module.

However, the problem arises of homogeneity of light intensity and that of the edge effects in the areas where these different devices are side by side.

In fact, not only must each device deliver very homogeneous light intensity, but this uniformity must also be respected from one lighting device to the other.

It is possible to adjust the light intensity delivered by each device by modifying the supply voltage of each source; however, this adjustment also affects the light spectrum.

An aim of this disclosure is to design a device for testing a large-size concentrated photovoltaic module that respects the constraints mentioned hereinabove, and that especially offers very good homogeneity of the light intensity, and is compatible with a compact test installation.

BRIEF SUMMARY

A device for testing a concentrated photovoltaic module is, therefore, proposed comprising a plurality of sub-modules, each sub-module comprising a plurality of assemblies of a photovoltaic cell and a concentrator arranged relative to the cell for concentrating radiation arriving at normal incidence toward the cell.

According to this disclosure, the test device comprises:
- a plurality of light sources,
- a plurality of parabolic mirrors coupled to the light sources so as to send the light coming from each source in a plurality of almost collimated light beams back toward the module to be tested, in a direction perpendicular to the surface of the module, each light source comprising:
- an optical system having an optical axis and comprising two parallel lenses arranged on either side of a diaphragm,
- a lamp arranged on the optical axis,
- a reflector arranged on the optical axis, to the side opposite the optical system relative to the lamp, the reflector being movable in translation along the optical axis so as to adjust the light intensity delivered by the source by having the distance between the reflector and the lamp vary,
- a casing containing the optical system, the lamp and the reflector and comprising an output orifice of the light beam, the orifice being arranged on the optical axis of the optical system.

For this purpose, the test device comprises a support adapted to maintain the photovoltaic module perpendicular to the almost collimated beam sent back by each mirror.

"Almost collimated beam" in the present disclosure means a beam whereof the divergence is low, typically less than 1°. In this disclosure, to reproduce the divergence of the sun, the almost collimated beam has a divergence of +/−0.25°.

As is known per se, each almost collimated beam is obtained by placing the orifice of each light source at the focal point or in the vicinity of the focal point of the parabolic mirror to which it is coupled, the skilled person being capable of defining the dimensional characteristics of the orifice and of the source-mirror couple to obtain such an almost collimated beam.

According to an embodiment, the lamp is a flash lamp.

The reflector can be a cylindrical or spherical mirror.

According to an embodiment of the invention, the device comprises as many parabolic mirrors as light sources, each light source being arranged at the focal point of the corresponding parabolic mirror.

According to an embodiment, the light sources are arranged in two rows extending horizontally on either side of the placement of the module on its support.

The parabolic mirrors are arranged so as to form two horizontal rows facing the placement of the module to be tested on the support.

Another object of this disclosure is a method for testing a concentrated photovoltaic module comprising a plurality of sub-modules, each sub-module comprising a plurality of assemblies of a photovoltaic cell and a concentrator arranged relative to the cell to concentrate radiation arriving in normal incidence toward the cell, the method being characterized in that a plurality of almost collimated light beams is sent toward the module in a direction perpendicular to the surface of the module by means of a plurality of light sources coupled to parabolic mirrors, each light source comprising:
- an optical system having an optical axis and comprising two parallel lenses arranged on either side of a diaphragm,
- a lamp arranged on the optical axis,
- a reflector arranged on the optical axis, to the side opposite the optical system relative to the lamp, the reflector being movable in translation along the optical axis,
- a casing containing the optical system, the lamp and the reflector and comprising an output orifice of the light beam, the orifice being arranged on the optical axis of the optical system, and wherein, the light intensity delivered by all of the specific light sources is previously made uniform by adjusting the distance between the reflector and the lamp for each light source.

According to an embodiment, as many light sources and parabolic mirrors as sub-modules of the photovoltaic module to be tested are used, each light source being coupled to a parabolic mirror so as to send an almost collimated light beam toward a corresponding sub-module.

Particularly advantageously, the light sources and the parabolic mirrors are arranged such that areas not illuminated by the almost collimated beams sent by the mirrors coincide with the areas separating the sub-modules from the module to be tested.

The surface of the module to be tested is preferably greater than or equal to 3 $m^2$.

According to an embodiment, the cells of the module are multi-junction cells.

BRIEF DESCRIPTION OF THE DRAWINGS

Other characteristics and advantages of the disclosure will emerge from the following detailed description in reference to the accompanying drawings, in which.

DETAILED DESCRIPTION

Figure 1A:
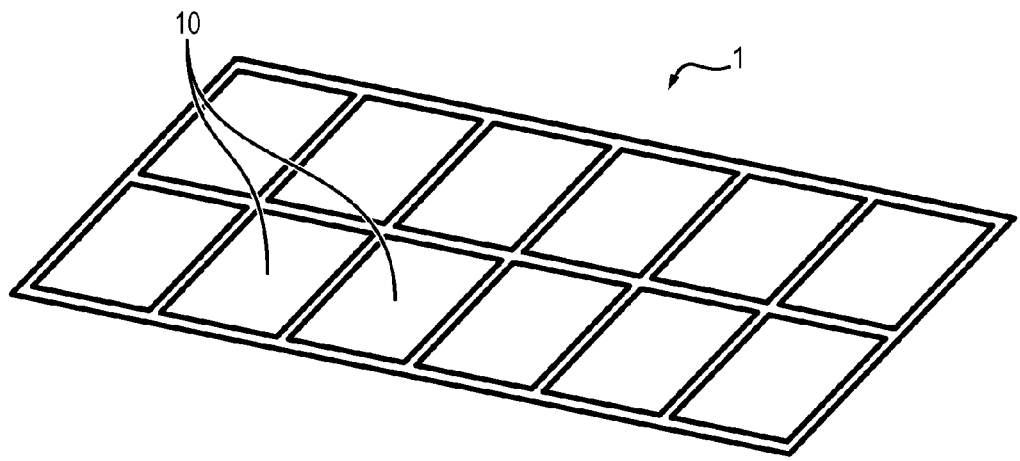
FIG. 1A is a schematic diagram of a concentrated photovoltaic module comprising several sub-modules connected in series.

FIG. 1A is a schematic diagram of a photovoltaic module that the disclosure tests.

Module 1 to be tested comprises a plurality of concentrated photovoltaic sub-modules 10.

Each sub-module 10 comprises a plurality of cell-concentrator assemblies.

Figure 1B:
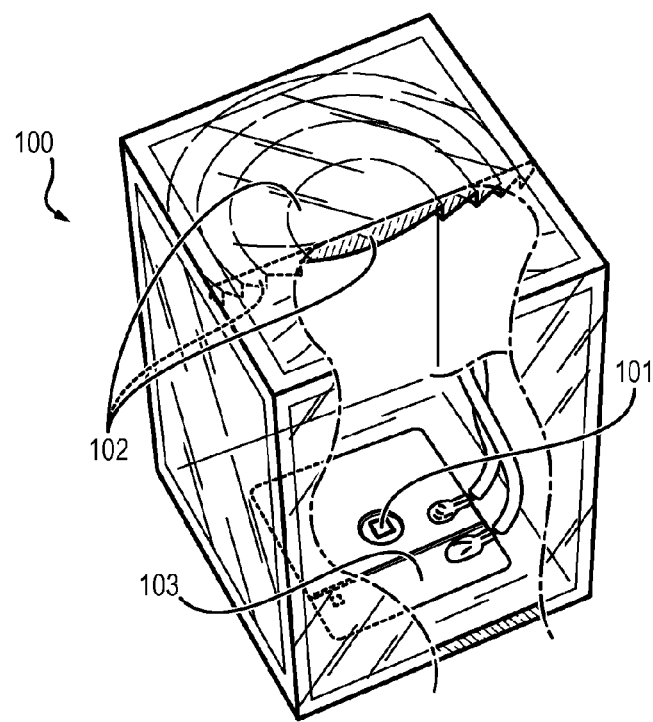
FIG. 1B is a schematic diagram of a photovoltaic cell-concentrator assembly belonging to a sub-module of such a module.

As illustrated in FIG. 1B, each assembly 100 essentially comprises a photovoltaic cell 101 (for example, multi-junction) and a concentrator 102 designed to concentrate the solar radiation arriving in normal incidence toward the cell 101. Optionally, the cell 101 is placed on a heat dissipater 103 to limit its rise in temperature.

The concentrator 102 comprises, for example, a Fresnel lens.

In the present disclosure, the surface of the module to be tested is the surface of the concentrators.

The sub-modules 10 forming the module 1 can optionally be electrically connected in series or in parallel.

The surface of each sub-module 10 has a generally rectangular shape, whereof the width and height are respectively in the following ranges: between 30 cm and 80 cm in width, for example, 60 cm, and between 60 cm and 150 cm in height, for example, 120 cm.

The sub-modules 10 are typically arranged in the form of rows and/or columns to form the module.

For example, a module of 8 $m^2$ can be formed from two rows of six sub-modules, each sub-module having a surface of around 0.7 $m^2$.

Figure 2:
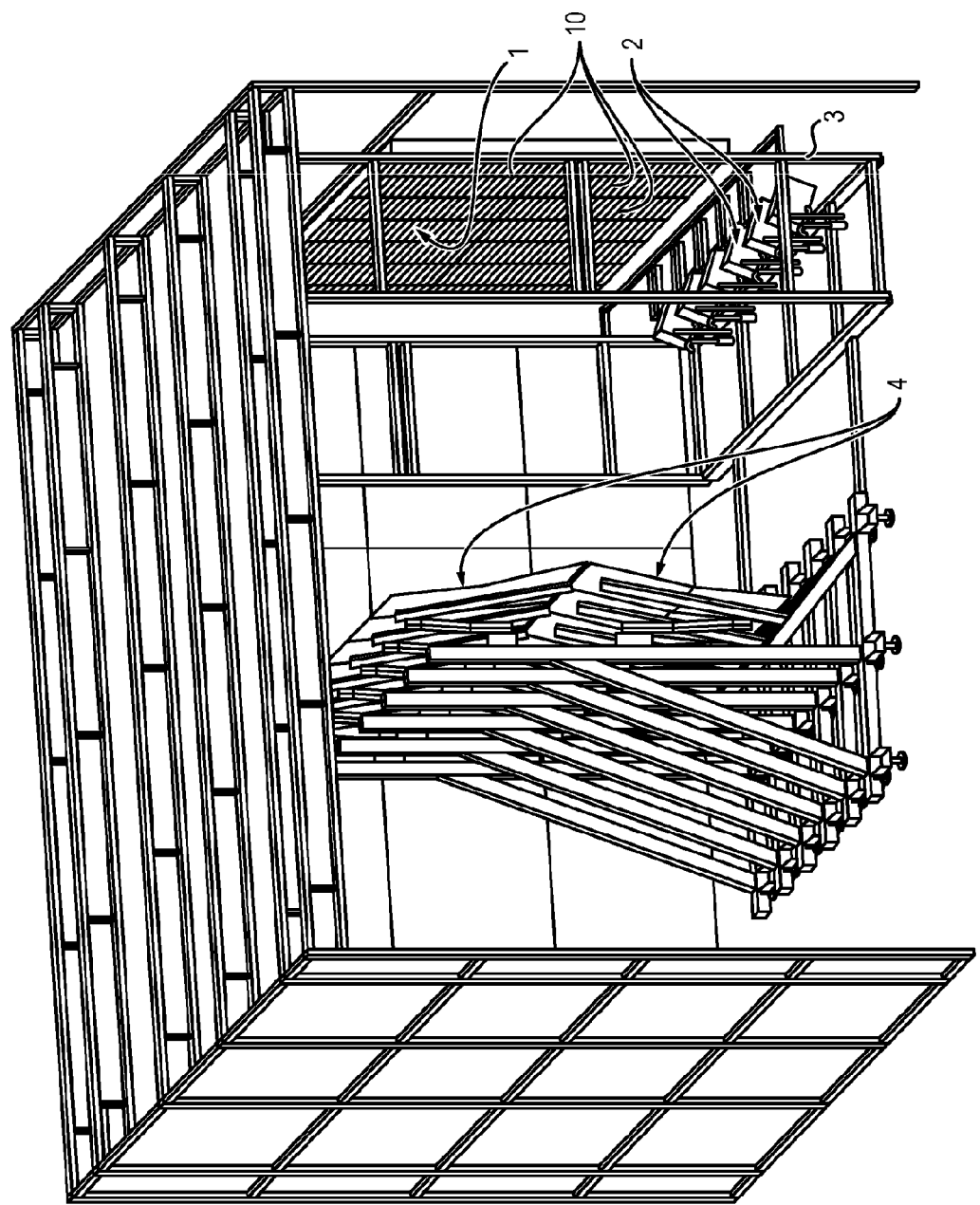
FIG. 2 is an assembly view of a test device according to the disclosure.

FIG. 2 is an assembly view of a test device according to the disclosure.

The device comprises a support 3 for the module 1 to be tested.

Preferably, the support 3 is arranged such that the surface of the module 1 to be tested is vertical.

"Vertical" in the present disclosure means a direction perpendicular to the floor of the building in which the test device is installed.

In front of the support 3, the test device comprises a plurality of light sources 2 and a plurality of parabolic mirrors 4 coupled to the light sources so as to reflect the light originating from each source in an almost collimated light beam in a direction perpendicular to the surface of the module.

According to a preferred embodiment, each source is arranged at the focal point of the corresponding parabolic mirror.

In this case, the test device, therefore, comprises as many sources as mirrors.

This utilizes a plurality of identical mirrors, whereof the position and orientation are adjusted so as to send back toward the module to be tested an almost collimated beam perpendicular to the surface of the module.

According to another embodiment, each light source can be coupled to several mirrors, to the extent where these mirrors are arranged such that their focal points are combined, the source being arranged at the placement of these focal points.

In the embodiment illustrated in FIG. 2, where the module 1 comprises two horizontal rows of six sub-modules 10, the test device comprises twelve light sources 2 placed according to two horizontal rows on either side of the module 1, and twelve parabolic mirrors 4 placed according to two horizontal rows facing the module 1.

Each source and the corresponding parabolic mirror are oriented relative to each other, wherein the light beam sent back by the mirror is perpendicular to the surface of the corresponding sub-module.

The distance between the sources and the parabolic mirrors is defined, wherein the almost collimated light beam sent back by each mirror illuminates the entire surface of the corresponding sub-module with the preferred characteristics.

This distance, as well as the surface of the mirrors, therefore, depends on the surface of the sub-modules of the module to be tested.

Without wanting to be limiting, it is considered that a distance of the order of 2 to 6 meters measured at the ground between the parabolic mirrors and the light sources, which determines the majority of the surface at the ground of the test device, is reasonable.

But it is not unreasonable for the number of light sources and parabolic mirrors to be identical to the number of sub-modules of the photovoltaic module to be tested.

In fact, if the surface of each sub-module is sufficiently low, it can eventuate that a light source-parabolic mirror couple illuminates several sub-modules and retains a ground space acceptable to the test device and a mirror size that does not impair its manufacturing cost.

On the other hand, there can be areas at the border between adjacent almost collimated beams in which the intensity fails to satisfy the criteria for uniformity or divergence.

In this case, the light sources and the parabolic mirrors are advantageously arranged so that areas not illuminated by the almost collimated beams sent by the mirrors coincide with the areas separating the sub-modules from the module to be tested, which are not functional in terms of photovoltaic conversion.

For reasons of assemblage of the modules, as is evident from FIG. 1A, there is, in fact, a space between two adjacent sub-modules 10 at which no photovoltaic conversion takes place.

In this way, if any defects in uniformity occur in these areas, these defects have no negative effect on the quality of the test.

To allow this adjustment, the test device is designed such that adjustment of the position and orientation of each mirror is possible.

Clearance is advantageously provided between the mirrors to enable such adjustments.

Figure 3:
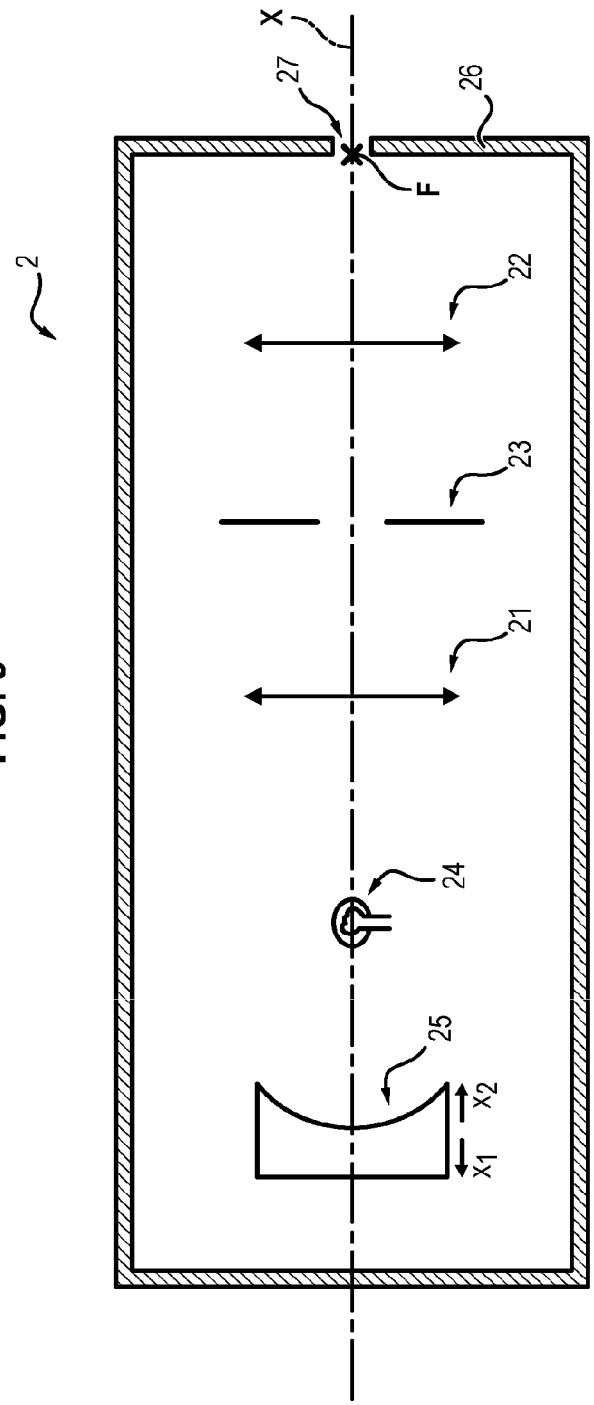
FIG. 3 is a schematic diagram of a light source of a test device according to the disclosure.

FIG. 3 is a schematic diagram of a light source capable of generating a light beam having the required characteristics.

Source 2 comprises an optical system having an optical axis X and comprising two parallel lenses 21, 22 arranged on either side of a diaphragm 23.

A lamp 24 is arranged on the optical axis X; "first lens" designates the lens 21 closest to the lamp and "second lens" designates the lens 22 arranged on the other side of the diaphragm 23 (lenses 21 and 22 and diaphragm 23 may be collectively referred to herein as the "optical system").

By way of advantage, the lamp 24 is a flash lamp. This lamp is selected for its capacity to produce the preferred light spectrum and irradiance. For example, the lamp 24 is a xenon flash lamp.

The diaphragm 23 is centered on the optical axis X and its function is to select only the central part of the beam coming from the first lens 21, so that each light source lights up only the parabolic mirror to which it is matched.

The light source 2 further comprises a reflector 25 arranged on the optical axis X of the side opposite the optical system 21, 22, 23 relative to the lamp 24 so as to send the light emitted by the lamp in the opposite direction back toward the optical system 21, 22, 23.

Reflector 25 is movable in translation (shown by the double-headed arrow $x_1$, $x_2$) along the optical axis X.

The reflector 25 can consist of a cylindrical, spherical or parabolic mirror. In the latter case, the mirror can be an axisymmetric parabolic mirror or a cylindro-parabolic mirror, that is, including a regulated surface, the cross-section of which is a parabola and whereof the generators extend in a plane perpendicular to the plane of the parabola.

For example, the mirror is made of polished aluminium.

The advantages of the mobile reflector in the source are the following:

First, the light intensity delivered by the source 2 can be adjusted by having the distance along the axis X between the reflector 25 and the lamp 24 vary.

Second, more light than that which would be recoverable with a single lamp is collected.

Finally, it homogenizes light emitted by the lamp to limit sensitivity to the geometry of the lamp and to positioning errors during lamp changes.

The assembly of the optical system 21, 22, 23 of the lamp 24 and of the reflector 25 is contained in a casing 26.

The casing 26 comprises an orifice 27 arranged on the optical axis X such that the different sources do not disturb each other, one source emitting light on a single mirror only.

The orifice 27 has a size, which can be typically between 1 mm and 7 cm, preferably between 1 cm and 5 cm, as a function of the distance between the source and the parabolic mirror.

Advantageously, the size of the orifice 27 is selected so as to obtain, by reflection on a parabolic mirror, an almost collimated beam having a divergence that is substantially equal to that of the sun (±0.25°) on a surface corresponding to that of each sub-module of the module to be tested.

For example, for a distance between the parabolic mirror and the source of 2.5 m, an orifice in the form of a disc of 3.5 cm in diameter produces an almost collimated beam having the preferred divergence.

In this way, the assembly formed by the lamp 24, the reflector 25 and the optical system 21, 22, 23 and emitting a light beam via the orifice 27 of the casing 26 forms a light source having the required characteristics for conducting the test of each sub-module.

The person skilled in the art is able to size the different components of the source so that it has the required characteristics.

With each light source being arranged at the focal point—or in the vicinity of the focal point—of a respective parabolic mirror, each mirror reflects light emitted by the corresponding source in the form of an almost collimated beam.

The orientation of the parabolic mirrors is defined so that each almost collimated beam is perpendicular to the surface of the module to be tested.

To ensure that the intensity of all the almost collimated beams is uniform (that is there is a difference between the strongest intensity and the weakest intensity of all the beams that is less than 5%), the intensity emitted by the source for each light source is previously adjusted.

This adjustment is done by controlling the distance between each lamp 24 and the corresponding reflector 25.

The intensity of each source is measured by means of a calibrated sensor provided for this purpose.

For example, a target intensity is defined and it is ensured that the intensity of each beam is contained in a range of intensity of 5% around the target intensity.

The module is installed on the support to perform a test on a photovoltaic module and the necessary electrical connections are made to record its response to lighting simulating the sun.

The position and orientation of the mirrors are adjusted if needed to light up the entire surface of each sub-module.

It is further verified that the assembly of light sources exhibits the required uniformity of intensity.

With each measurement of a sub-module, this verification is done automatically by the intensity-measuring sensor mentioned earlier.

This verification is not necessarily done before each test on a new module.

In fact, once the uniformity of the intensity was regulated for a given assembly of sources (for example, when the test device is commissioned, and/or after replacement of a light source or a component of such a source), it can be considered that this uniformity will not vary over time.

If needed, if this verification reveals a defect in uniformity, the intensity of one or more light sources is adjusted to produce the required uniformity.

Once any necessary adjustments have been made, the lamps of all the sources are simultaneously switched on.

The beam emitted by each light source is sent back by the corresponding parabolic mirror in the form of an almost collimated beam toward the corresponding sub-module, in a direction perpendicular to the surface of the module.

The current-voltage characteristics of each sub-module are recorded; then the results are processed to determine the electric power the module is capable of providing.

The invention claimed is:

1. A device for testing a concentrated photovoltaic module comprising a plurality of sub-modules, each sub-module comprising a plurality of assemblies of a photovoltaic cell and a concentrator arranged relative to the cell for concentrating radiation arriving at normal incidence toward the cell, the test device comprising:
   a plurality of light sources,
   a plurality of parabolic mirrors coupled to the light sources so as to send the light coming from each source in a plurality of almost collimated light beams back toward the module to be tested, in a direction perpendicular to the surface of the module,
wherein each light source comprises:
   an optical system having an optical axis and comprising two parallel lenses arranged on either side of a diaphragm,
   a lamp arranged on the optical axis,
   a reflector arranged on the optical axis, to the side opposite the optical system relative to the lamp, the reflector being movable in translation along the optical axis, so as to adjust the light intensity delivered by the source by having the distance between the reflector and the lamp vary,
   a casing containing the optical system, the lamp and the reflector and comprising an output orifice of the light beam, the orifice being arranged on the optical axis of the optical system.

2. The device according to claim 1, wherein the lamp is a flash lamp.

3. The device according to claim 2, wherein the reflector is a parabolic mirror.

4. The device according to claim 3, wherein the test device comprises as many parabolic mirrors as light sources, each light source being arranged at the focal point of the corresponding parabolic mirror.

5. The device according to claim 4, further comprising a support for the module to be tested, wherein the light sources are arranged in two rows extending horizontally on either side of the placement of the module on the support.

6. The device according to claim 5, wherein the parabolic mirrors are arranged so as to form two horizontal rows facing the placement of the module to be tested on the support.

7. A method for testing a concentrated photovoltaic module comprising a plurality of sub-modules, each sub-module comprising a plurality of assemblies of a photovoltaic cell and a concentrator arranged relative to the cell for concentrating radiation arriving at normal incidence toward the cell, wherein a plurality of almost collimated light beams is sent toward the module in a direction perpendicular to the surface of the module from a plurality of light sources coupled to parabolic mirrors, each light source comprising:
   an optical system having an optical axis and comprising two parallel lenses arranged on either side of a diaphragm,
   a lamp arranged on the optical axis,
   a reflector arranged on the optical axis, to the side opposite the optical system relative to the lamp, the reflector being movable in translation along the optical axis,
   a casing containing the optical system, the lamp and the reflector and comprising an output orifice of the light beam, the orifice being arranged on the optical axis of the optical system,
wherein the light intensity delivered by all of the specific light sources is previously made uniform by adjusting the distance between the reflector and the lamp for each light source.

8. The method according to claim 7, wherein as many light sources and parabolic mirrors as sub-modules of the photovoltaic module to be tested are used, each light source being coupled to a parabolic mirror so as to send an almost collimated light beam toward a corresponding sub-module.

9. The method according to claim 8, wherein the light sources and the parabolic mirrors are arranged such that areas not illuminated by the almost collimated beams sent by the mirrors coincide with the areas separating the sub-modules from the module to be tested.

10. The method according to claim 9, wherein the surface of the module to be tested is greater than or equal to 3 m$^2$.

11. The method according to claim 10, wherein the cells of the module are multi-junction cells.

12. The method according to claim 7, wherein the surface of the module to be tested is greater than or equal to 3 m$^2$.

13. The method according to claim 7, wherein the cells of the module are multi-junction cells.

14. The device according to claim 1, wherein the reflector is a parabolic mirror.

15. The device according to claim 1, wherein the test device comprises as many parabolic mirrors as light sources, each light source being arranged at the focal point of the corresponding parabolic mirror.

16. The device according to claim 1, further comprising a support for the module to be tested, wherein the light sources are arranged in two rows extending horizontally on either side of the placement of the module on the support.

* * * * *